ical-application-element-containing-the-single-crystal

United States Patent [19]
Kitamura et al.

[11] Patent Number: 5,904,912
[45] Date of Patent: May 18, 1999

[54] IRON-DOPED LITHIUM NIOBATE SINGLE CRYSTAL, METHOD FOR HEAT TREATMENT THEREOF AND HOLOGRAM-APPLICATION ELEMENT CONTAINING THE SINGLE CRYSTAL

[75] Inventors: Kenji Kitamura; Yasunori Furukawa; Nobuo Ii; Shigeyuki Kimura, all of Tsukuba, Japan

[73] Assignee: National Institute for Research in Inorganic Materials, Tsukuba, Japan

[21] Appl. No.: 08/778,273

[22] Filed: Jan. 2, 1997

[30] Foreign Application Priority Data

Jul. 30, 1996 [JP] Japan ..................... 8-216580

[51] Int. Cl.⁶ .......................... C01G 49/00; C01G 33/00; C01D 15/00; C30B 29/00
[52] U.S. Cl. .......................... 423/594; 423/275; 117/948
[58] Field of Search ................. 423/594, 275, 423/593; 117/948; 359/3, 7

[56] References Cited

U.S. PATENT DOCUMENTS 3,932,299   1/1976   Phillips ..................... 423/594

FOREIGN PATENT DOCUMENTS 2908585   9/1980   Germany ..................... 359/3
585753   11/1978   U.S.S.R. ..................... 359/7

OTHER PUBLICATIONS

Yasunori Furukawa et al, "Optical Damage Resistance and Crystal Quality of $LiNbO_3$ Single Crystals with Various [Li]/[Nb] Ratios", J. Appl. 72 (8), pp. 3250–3254, Oct. 15, 1992.

J.R. Carruthers et al, "Nonstoichiometry and Crystal Growth of Lithium Niobate," Journal of Applied Physics, vol. 42, No. 5, Apr., 1971.

P. Lerner et al, "Stoechiometrie des Monocristaux de Metaniobate be Lithium," Journal of Crystal Growth 3, 4 (1968) 231–235, No Month.

von der Linde, et al., "Multiphoton photorefractive . . . $LiNbO3$" Applied Physics Lett. 25(3), Aug., 1974, pp. 155–157.

Gulanyan, et al., "Nondestructive readout of . . . iron doped lithium niobate crystals" Sov. J. Quantum Electron. 9(5), pp. 647–649, May 1979.

*Primary Examiner*—Steven Bos
*Attorney, Agent, or Firm*—Oblon, Spivak, McClelland, Maier & Neustadt, P.C.

[57] ABSTRACT

An iron-doped lithium niobate single crystal having a molar fraction of $Li_2O/(Nb_2O_5+Li_2O)$ of from 0.495 to 0.50 which is closer to the stoichiometrical composition than a usual congruent composition, and a high diffraction efficiency by a two light wave mixture.

4 Claims, 6 Drawing Sheets

Fe-DOPED CONGRUENT COMPOSITION LN SINGLE CRYSTAL

Fe-DOPED STOICHIOMETRICAL COMPOSITION LN SINGLE CRYSTAL

Fe-DOPED CONGRUENT COMPOSITION LN SINGLE CRYSTAL

Fe-DOPED STOICHIOMETRICAL COMPOSITION LN SINGLE CRYSTAL

IRON-DOPED LITHIUM NIOBATE SINGLE CRYSTAL, METHOD FOR HEAT TREATMENT THEREOF AND HOLOGRAM-APPLICATION ELEMENT CONTAINING THE SINGLE CRYSTAL

BACKGROUND OF THE INVENTION

1. Field of the Invention

The present invention relates to a lithium niobate ($LiNbO_3$, which will hereinafter be referred to simply as LN) single crystal which is useful in the field of e.g. optical information processing, photo-processing, photochemical reaction or photometric control, utilizing a laser beam. More particularly, it relates to a LN single crystal for an optical element having improved hologram diffraction efficiency and response speed, a method for heat treatment thereof and a hologram-application element containing the LN single crystal.

2. Discussion of Background

When a LN single crystal is used for an optical application, if a strong laser beam is irradiated thereto, a local change in refractive index (a photo-refractive effect) appears, and an attention has been drawn to an application in which this photo-refractive effect is positively utilized and applied to a phase-type hologram recording element as a highly sensitive optical memory. With respect to the photo-refractive effect, its mechanism has been explained as follows. Namely, the photo-refractive effect is a phenomenon which occurs when light is irradiated to an electro-optic crystal having a deep trap level (i.e. a photo-refractive center) attributable to an impurity or defect. The photo-refractive center is photoionized, and free carriers thereby formed are diffused and moved by e.g. the external electric field or the photovoltaic effect and then reunited at a non-irradiated portion, whereby a space-charge distribution corresponding to the light intensity distribution will be formed. This space-charge distribution will bring about the change in refractive index by the electrooptical effect. This is the photo-refractive effect.

In order for the above mechanism to function, there must be an ionized trap level at the initial state. For examples, in a LN single crystal, $Fe^{2+}$ forms a doner level, which is ionized to $Fe^{3+}$ thus forming a trap level. Accordingly, it has been known that an impurity, particularly a transition metal impurity, contained in the crystal plays an important role for the photo-refractive effect. Especially, a LN single crystal is relatively inexpensive among many electro-optic crystals and a large size crystal is readily available. Besides, it has an excellent characteristic as compared with other photo-refractive crystals, such that the recording time of hologram lasts at least a few months. Accordingly, it is used for a research for an application to a memory element for phase type hologram recording.

On the other hand, a LN single crystal with a congruent composition having no transition metal incorporated, has an extremely low hologram diffraction efficiency and thus is not suitable for such an application. To improve the hologram diffraction efficiency of a LN single crystal, it has been heretofore common to employ a crystal having a few hundred ppm of Fe incorporated. In such a case, the composition of the mother crystal is a congruent composition. The reason for employing this composition is that it has been believed that in order to produce a LN single crystal having a high uniformity of composition, it is essential to grow the crystal by a rotational withdrawing method from a melt having a congruent composition with a molar fraction of $Li_2O/(Nb_2O_5+Li_2O)$ of 0.485, where the crystal and melt are coexistent in equilibrium with the same composition.

Further, the LN single crystal as grown from this congruent composition, has a multi-domain structure. Accordingly, treatment for single domain used to be applied in such a manner that the crystal after growing was heated to a temperature of at least about 1,150° C. i.e. the Curie point, and a voltage was applied in the Z axis direction of the crystal in the heated state to align the domain in one direction, followed by cooling the crystal. The single domain-treated crystal was processed into a predetermined size and then used for various optical applications.

As a single crystal to be used for an optical laser device for writing a three dimensional hologram in the single crystal by means of a visible light laser beam, the LN single crystal with a congruent composition having no transition metal incorporated, is transparent and of a high quality with a uniform crystal composition without crystal defects such as striations. However, the hologram diffraction efficiency is extremely low, and there was a problem that it was difficult to write an application hologram in the crystal.

Therefore, a LN single crystal having the hologram diffraction efficiency improved by an addition of a transition metal such as Fe to the LN single crystal, has been used for a research. However, with a crystal grown by an addition of iron in a substantial amount to the congruent composition, crystal defects such as striations are likely to be taken into the crystal, and such defects will bring about optical non-uniformity or non-uniform scattering of the laser beam, whereby there has been a problem that the hologram diffraction efficiency substantially varies depending upon the portion of the crystal, and it has been difficult to obtain a constant hologram diffraction characteristic.

Further, a coupling coefficient is used as a performance index for comparing the crystal materials showing such photo-refractive effects. In the case of Fe-doped LN single crystals so far known, the coupling coefficients are reportedly from about 4 to 12 $cm^{-1}$ (for examples Optical Crystals, p.200, edited by Shintaro Miyazawa, published by Baifukan), which are not necessarily sufficient for optical applications.

Further, from the viewpoint of preparation of a crystal, a transition metal segregates in the crystal. Accordingly, it is difficult to grow a crystal having such a transition metal uniformly incorporated, and macroscopic crystal defects which cause light scattering, are usually contained in a substantial amount in a LN single crystal with a Fe-doped congruent composition. Thus, a product having a quality sufficient for an optical element has not been obtained.

Furthermore, a noise which is believed to be caused by random light scattering due to non-uniformity of the Fe-doped LN single crystal, has been regarded as a problem which prevents improvement of the recording density of the hologram. Further, with a crystal having iron incorporated into a congruent composition there has been a problem that it takes too long a time for the hologram diffraction efficiency to reach a constant level (the response time for writing a hologram). This results in difficulty in that the writing speed is too slow for application to a hologram-application element.

Recently, the present inventors have found it possible to improve the hologram diffraction efficiency without adding iron, by bringing the composition of the LN single crystal close to the stoichiometrical composition. Even in this case, the problem that the response time for writing a hologram is long, has not been solved.

SUMMARY OF THE INVENTION

Under these circumstances, the present inventors have conducted an extensive research to solve the above problems. As a result of a research on the crystal growth by controlling the crystal composition of the LN single crystal and the heat treatment technique of the crystal, they have found it possible to obtain a LN single crystal which has a high diffraction efficiency and high writing speed and which is excellent in the crystal quality without crystal defects such as voids or striations causing light scattering, by growing a crystal having iron incorporated to the stoichiometrical composition and applying heat treatment thereto to control the photo-refractive effect characteristics. Thus, it is an object of the present invention to provide a LN single crystal which has a high quality with a uniform crystal structure and which is excellent in the diffraction efficiency.

In a first aspect, the present invention provides a lithium niobate single crystal having a molar fraction of $Li_2O/(Nb_2O_5+Li_2O)$ of from 0.495 to 0.050 which is closer to the stoichiometrical composition than a usual congruent composition, and a high diffraction efficiency by a two light wave mixture.

In a second aspect, the present invention provides an iron-doped lithium niobate single crystal having an iron content of from 10 to 500 ppm, a molar fraction of $Li_2O/(Nb_2O_5+Li_2O)$ of from 0.495 to 0.050, and a coupling coefficient by a two light wave mixture employing a wavelength of 532 nm, being larger than 15 $cm^{-1}$.

In a third aspect, the present invention provides an iron-doped lithium niobate single crystal having an iron content of from 10 to 500 ppm, a molar fraction of $Li_2O/(Nb_2O_5+Li_2O)$ of from 0.495 to 0.050, and a response time for writing a hologram by a two light wave mixture employing a laser beam with a pump light intensity of 1 $W/cm^2$, being at most 30 seconds.

In a fourth aspect, the present invention provides a method for heat treatment of the iron-doped lithium niobate single crystal as defined above, which comprises heat-treating the single crystal at a temperature of not higher than the Curie point in a reducing atmosphere.

In a fifth aspect, the present invention provides a hologram-application element for recording information by writing a volume hologram in a single crystal by means of a visible light laser beam, wherein the iron-doped lithium niobate single crystal having a hologram response speed, as defined above, is used as the single crystal. Namely, the fifth aspect is directed to a phase type hologram application element which is designed to utilize the photo-refractive effect caused by irradiating a visible light to an iron-doped LN single crystal having a composition close to the stoichiometrical composition.

Namely, by satisfying the requirements of the first aspect of the present invention, it is possible to provide a LN single crystal having the hologram writing efficiency improved substantially. Further, by satisfying the requirements of the second aspect, it is possible to improve the response speed for writing a hologram. By satisfying the composition as specified in the first and second aspects, it is possible to obtain an iron-doped LN single crystal which does not require conventional treatment for single domain and which is excellent in the composition and optical uniformity without crystal defects such as voids or striations causing light scattering and has a high hologram diffraction efficiency. Such a LN single crystal is expected to be very useful for application to an optical amplification device including a phase type hologram memory element.

Firstly, the LN single crystal of the present invention is an iron-doped LN single crystal which is characterized in that the coupling coefficient by a two light wave mixture employing a wavelength of 532 nm, is as large as from 20 to 30 $cm^{-1}$, and the response time for writing a hologram by a two light wave mixture employing a laser beam with a pump light intensity of 1 $W/cm^2$, is at most 30 seconds.

Further, the LN single crystal according to the present invention is a single crystal having a composition with a molar fraction of from 0.495 to 0.50 which is closer to the stoichiometrical composition than a usual congruent composition with a molar fraction of $Li_2O/(Nb_2O_5+Li_2O)$ of 0.485, whereby completeness of the crystal is high, and the defect density is low. Further, it is an iron-doped LN single crystal which requires no treatment for single domain and which is excellent in the composition and optical uniformity without crystal defects such as voids or striations causing light scattering and has a high hologram diffraction efficiency.

BRIEF DESCRIPTION OF THE DRAWINGS

In the accompanying drawings.

DETAILED DESCRIPTION OF THE PREFERRED EMBODIMENTS

Now, the present invention will be described in detail with reference to the preferred embodiments.

As the starting materials to be used in the present invention, for the Li component and the Nb component, their oxides or compounds which can be converted to such oxides by heating, such as $Li_2CO_3$ and $Nb_2O_5$, may be used. These starting material components are mixed so that the molar fraction of $Li_2O/(Nb_2O_5+Li_2O)$ will be from 0.495 to 0.50, which is close to the stoichiometrical composition rather than a usual congruent composition, and Fe is incorporated thereto so that the iron content will be from 10 to 500 ppm. The Fe component is not particularly limited, but it is preferred to incorporate it in the form of iron oxide.

Figure 12:
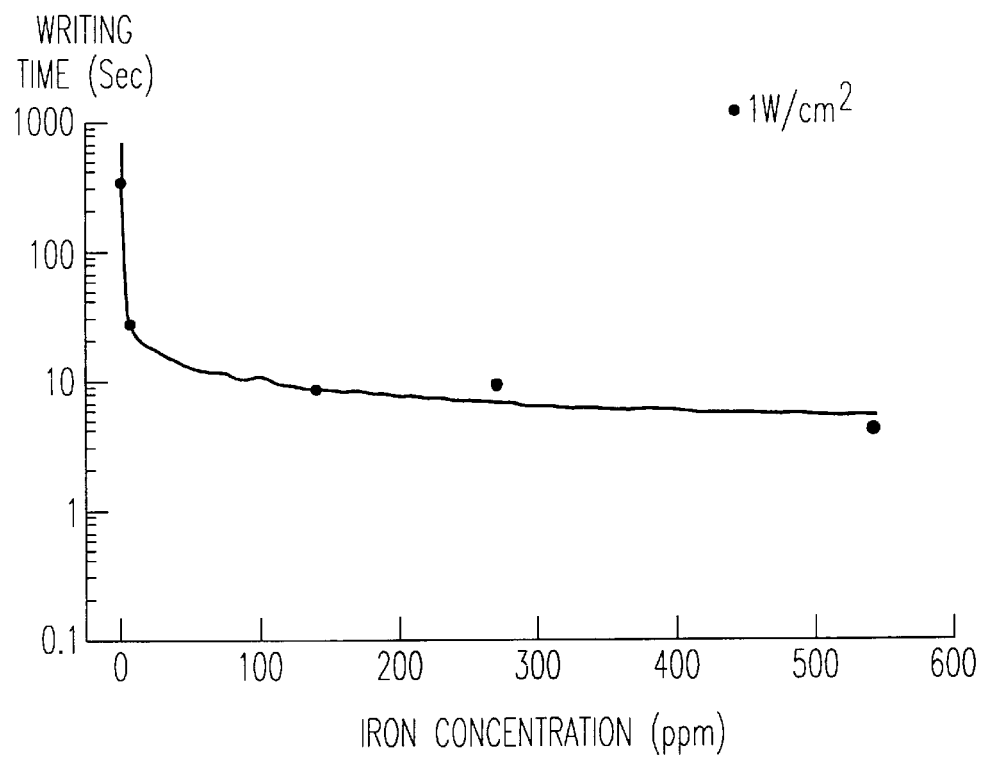
FIG. 12 is a graph showing the dependency on the Fe concentration of the hologram writing time of a LN crystal with a composition close to the stoichiometrical composition.

When iron is incorporated to the congruent composition, the hologram diffraction efficiency and the coupling coefficient will be larger than those of a crystal having no iron incorporated, and it is known that the larger the iron content, the more the improvement in the hologram diffraction efficiency and the coupling coefficient. However, a crystal with the stoichiometrical composition already has high hologram diffraction efficiency and coupling coefficient in a no iron-incorporated state, and the improvement in these properties by incorporation of iron is not so remarkable as compared with the congruent crystal. As shown in FIG. 12, from the measurement of the diffraction efficiency, it has been found that if the iron content in a crystal with the stoichiometrical composition is at least 10 ppm, the writing speed is substantially improved over the case where no iron is incorporated, and it can be improved to a level of at most 30 seconds. Further, as the amount of iron is increased, the crystal growth tends to be difficult, whereby there has been a problem that polycrystallization takes place during the growing, and cracks are likely to form during cooling. A crystal of good quality is obtained without a problem such as cracking, when the iron content in the crystal is not higher than 500 ppm. Accordingly, it has been found from these results that the iron content is suitably from 10 to 500 ppm, preferably from 100 to 300 ppm.

As opposed to a congruent composition where the crystal and the melt are co-existent in equilibrium with the same composition, the composition of the LN melt in the process for producing a LN single crystal of the present invention is prepared to be closer to the stoichiometrical composition rather than the usual congruent composition, so that the molar fraction of $Li_2O/(Nb_2O_5+Li_2O)$ is from 0.495 to 0.50, and from 10 to 500 ppm of iron is incorporated thereto. The crystal with such a composition can be prepared by a floating zone method. However, it is preferred to grow the crystal by a double crucible method, whereby a product having a higher quality and a large size can be obtained.

The double crucible method will be briefly described.

Figure 9:
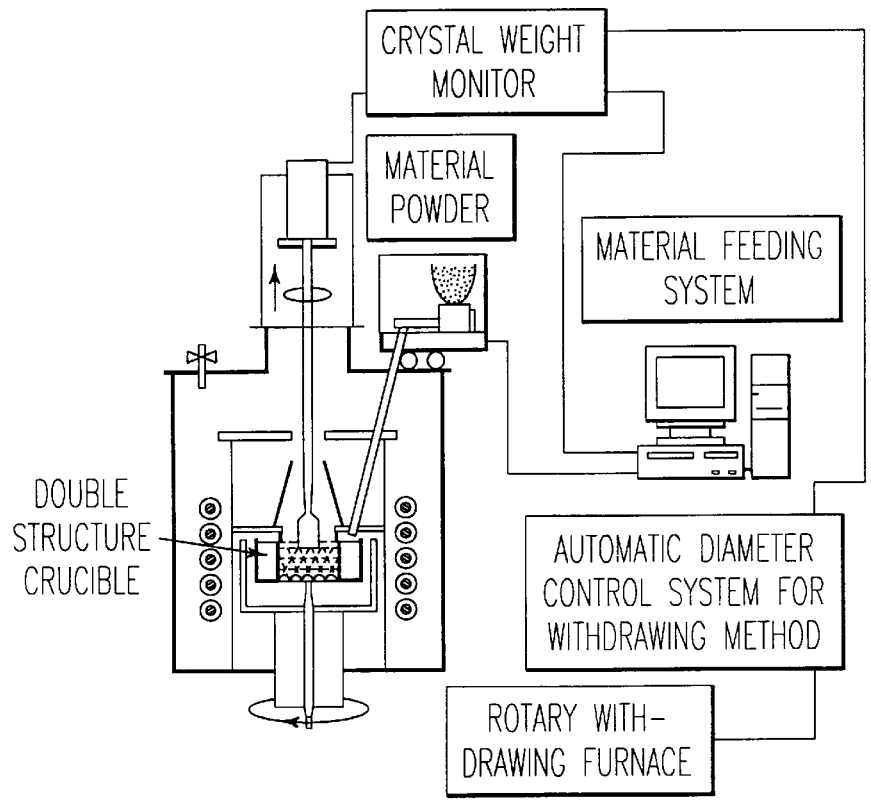
FIG. 9 is a view illustrating a single crystal-growing apparatus by a double crucible method for growing a LN single crystal with the stoichiometrical composition.

The congruent composition of a LN single crystal has a molar fraction of $Li_2O/(Nb_2O_5+Li_2O)$ of 0.485. Accordingly, a LN single crystal obtained by a usual withdrawing method from the melt of the congruent composition tends to contain an excessive Nb component. Whereas, when the composition of the melt is adjusted so that the Li component is substantially excessive (for examples the molar fraction of $Li_2O/(Nb_2O_5+Li_2O)$ is from 0.056 to 0.60, preferably 0.58), it is possible to obtain a single crystal close to the stoichiometrical composition i.e. a single crystal wherein the concentration of non-stoichiometric defects is suppressed. However, if the composition of the growing crystal and the composition of the melt are different in a usual growing method, as the growing proceeds, the composition of the melt further departs from the composition of the crystal, whereby crystallization tends to be difficult. Therefore, in order to precisely control the structure and the density of non-stoichiometric defects, a crucible having a double structure as shown in FIG. 9 is used for growing a single crystal. In this double crucible method, the crucible has a double structure, and at the bottom of the inner crucible, a hole is provided for communication from the outer crucible to the inner crucible. Using such a crucible having a double structure, the weight of the crystal grown from the melt of the inner crucible having an excessive Li component with a molar fraction of $Li_2O/(Nb_2O_5+Li_2O)$ of from 0.56 to 0.60, is measured by a load cell, and a starting material having the stoichiometrical composition with a molar fraction of $Li_2O/(Nb_2O_5+Li_2O)$ of 0.50 is automatically supplied to the outer crucible in an amount corresponding to the crystallized amount. By this method, the crystal can be grown from the melt maintained at a constant depth with a constant composition, by the supply of the starting material from the outer crucible to the inner crucible, whereby it has been made possible for the first time to grow a large single single crystal having a uniform composition.

If the crystal is grown from a melt having a molar fraction of $Li_2O/(Nb_2O_5+Li_2O)$ of from 0.495 to 0.50 as described above, the Curie point of the crystal composition will be about 1,200° C. which is higher than 1,150° C. of a usual crystal with a congruent composition and close to the temperature for crystal growth, whereby even as grown, the majority of the crystal is in a single domain state. Therefore, as is substantially different from a crystal in a multi-domain state grown from a melt with a conventional congruent composition, the crystal in a single domain state has a merit such that it is unnecessary to apply bowling treatment after growing, which is required for a multi-domain crystal. Further, by using the double crucible method as the method for growing the crystal, the composition of the melt from which the crystal is grown, can be always maintained to be constant, and the change in the temperature of the melt in the inner crucible is very little. Accordingly, it is possible to produce a LN single crystal having an extremely uniform composition and good optical uniformity without voids or striations which are likely to cause light scattering and which used to be observed in a crystal having an iron-added congruent composition.

Further, according to the method for preparing a LN single crystal of the present invention, heat treatment is applied to an iron-doped LN single crystal having a composition close to the stoichiometrical composition, after growing, whereby the writing speed of a hologram can be controlled to a large extent. Various heat treatment conditions have been studied in experiments conducted in the course for arriving at the present invention, whereby it has been found possible to improve the grating writing speed by heat-treating the LN single crystal in a reducing atmosphere, and it has further been found that when the heat treatment is carried out in a reducing atmosphere containing steam, more remarkable improvement in the grating writing speed is possible. The writing speed of a hologram usually depends on the intensity of light which is used, and the higher the intensity of the light, the higher the writing speed. Accordingly, if a laser beam having high light intensity is used, writing can be carried out at a high speed. However, a laser having high light intensity requires a large apparatus and is expensive. Accordingly, a material with which high speed writing is possible with a low light intensity, is desirable, and it is evident that the method for preparing a LN single crystal of the present invention provides remarkable effects in this connection.

With respect to the conditions for this heat treatment, heat treatment is applied at a temperature of from 900 to 1,000° C. for about 12 hours in an atmosphere having a controlled oxygen partial pressure.

Further, the laser apparatus of the present invention is an optical amplification apparatus for writing a three dimensional hologram in a single crystal by means of a visible light laser beam. The three dimensional hologram is high speed and has a potentially large memory capacity. Accordingly, its future development is expected as a new recording method for recent multimedia field. For hologram, various materials including silver salt photographs are used. However, for application to memory devices, a photo-refractive crystal is believed to be most effective, and especially a LN single crystal is a material having the longest memory retention time among many photo-refractive crystals. In the conventional experiments for memory, in most cases, a LN single crystal with a congruent composition colored brown and having the diffraction efficiency increased by an addition of Fe as a transition metal, has been used. However, such a Fe-doped congruent LN single crystal has substantial absorption or scattering in a visible light range of from about 400 to 600 nm, and variation in the properties depending upon the sample is large, so that it has not yet been practically used as a hologram recording material.

The present inventors have found for the first time a phenomenon such that by adding iron to the stoichiometrical composition and applying heat treatment thereto, it is possible to obtain a crystal which is uniform and of a high quality, whereby a sufficiently high writing speed and a sufficiently large diffraction efficiency required for a laser apparatus are obtainable. A hologram application element for writing a three dimensional hologram by means of a LN single crystal according to the present invention, has been made possible for the first time by the present inventors.

Now, the present invention will be described in further detail with reference to Examples. However, it should be understood that the present invention is by no means restricted to such specific Examples.

EXAMPLE 1

With respect to a LN crystal grown by the present invention, the hologram diffraction efficiency, the coupling coefficient and the hologram writing time were evaluated by a two light wave mixture experiment.

Figure 1:
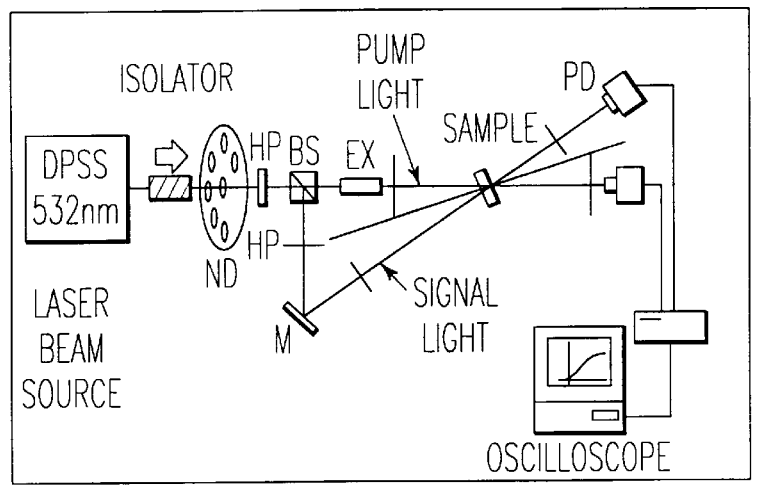
FIG. 1 is a diagrammatical view illustrating an experiment in which a hologram is written in a LN single crystal by a two light wave mixture, to obtain the diffraction efficiency.
Figure 2:
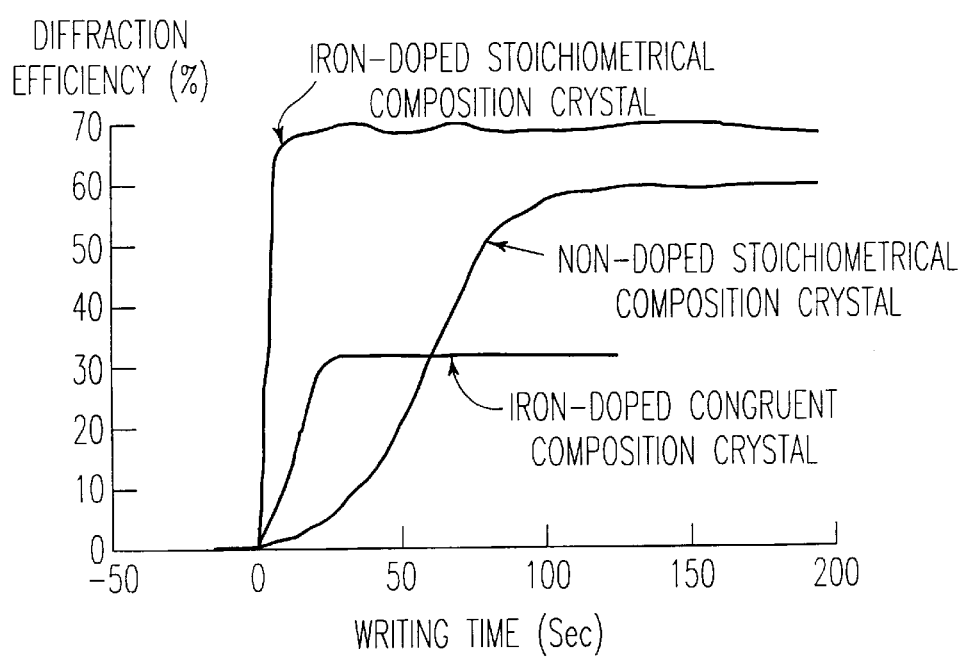
FIG. 2 is a graph showing the diffraction efficiency and the writing time obtained from the change in the energy amplification in the signal light by a two light wave mixture.

The optical system used for the experiment is diagrammatically shown in FIG. 1. As shown in FIG. 1, two coherent light waves which are referred to as pump light and signal light, respectively, are crossed in the LN single crystal which is a photo-refractive crystal, to form a plurality of interference fringes. A space electric field corresponding to the spatial intensity change of the interference fringes, was formed, and as a result, a refractive index lattice was formed in the crystal. As the phase of the refractive index lattice is shifted by $\pi/2$ against the interference fringes, the transmitted signal light passed through the photo-refractive crystal, which has the same phase, is subjected to light intensity amplification, whereas the transmitted pump light which has an inverse phase, is subjected to light intensity attenuation. As a result, the energy will be transferred from the pump light to the signal light by the two light wave mixture, whereby, as shown in FIG. 2, optical amplification of the signal light was observed on the oscilloscope, and the diffraction efficiency was obtained from the ratio in the signal light intensity before and after mixing the two light waves.

Here, a green light having a wavelength of 532 nm, which is a two-fold wave of a Nd:YAG laser, was used as the pump light and the signal light. In the experiment, the beam diameters were 1 mm, respectively, and the light intensity ratio of the pump light to the signal light was maintained to be constant at 100:1. The crossing angle of the two light waves was set to be about 15° so that the diffraction efficiency became maximum, whereby the space between the interference fringes was about 0.9 $\mu$m. The thickness of the sample used, was 2 mm. FIG. 2 shows a comparison in the hologram writing time with the signal light intensity being 3 mW/cm$^2$ and the pump light intensity being 300 mW/cm$^2$, with respect to a LN crystal with the stoichiometrical composition having 200 ppm of iron incorporated, a LN crystal with the congruent composition having 200 ppm of iron incorporated and a LN crystal with the stoichiometrical composition having no additive incorporated. With the iron-doped stoichiometrical composition LN crystal, the highest diffraction efficiency and the highest writing speed were obtained. Namely, the diffraction efficiency of the iron-doped stoichiometrical composition LN crystal was as high as about 70%, while the diffraction efficiency of the iron-doped congruent composition LN crystal was 20%, and the diffraction efficiency of the non-doped stoichiometrical composition LN crystal was 59.5%. Further, the hologram writing speed (the time until the diffraction efficiency saturates to a constant level) of the iron-doped stoichiometrical composition LN crystal was highest at a level of about 12 seconds, as compared with about 25 seconds with the iron-doped congruent composition LN crystal and 115 seconds with the non-doped stoichiometrical composition LN crystal.

Figure 3:
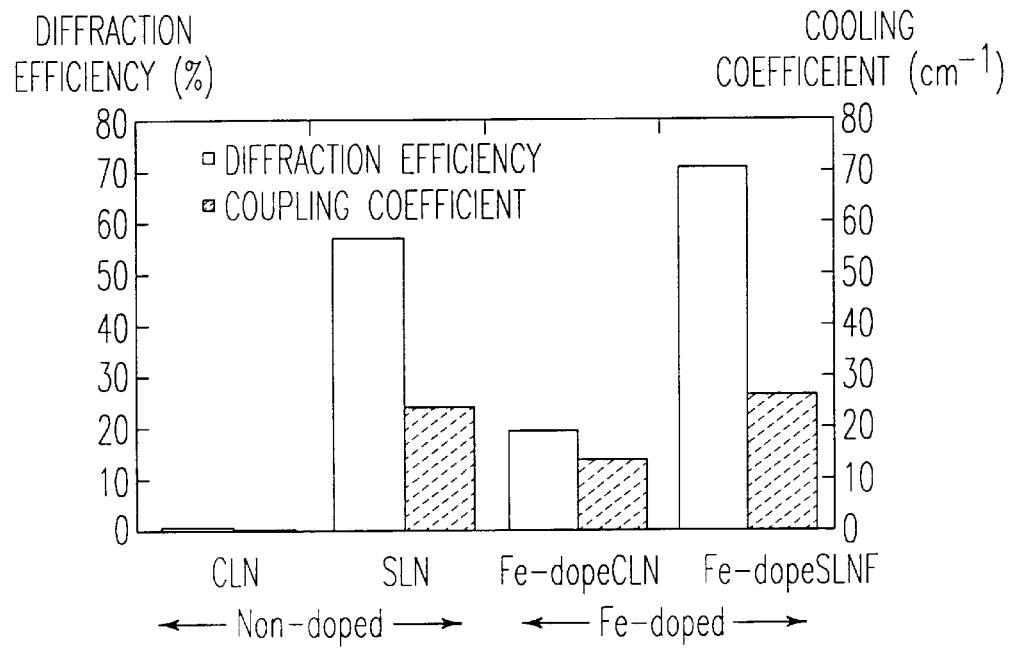
FIG. 3 is a graph in which the results of the diffraction efficiency and the coupling coefficient of signal lights of various LN single crystals, are compared.

FIG. 3 is a graph showing a comparison of the results in the determination of the diffraction efficiency of the signal light and the coupling coefficient with respect to each of the non-doped congruent composition LN single crystal (CLN), the non-doped stoichiometrical composition LN single crystal (SLN), the Fe-doped congruent composition LN single crystal (Fe-dopeCLN) and the iron-doped stoichiometrical composition LN single crystal (Fe-dopeSLN).

In FIG. 3, with the non-doped congruent composition LN single crystal, each of the diffraction efficiency and the coupling coefficient is as small as no higher than 1, while with the non-doped stoichiometrical composition LN single crystal, both the diffraction efficiency and the coupling coefficient are as high as 60% and 25 cm$^{-1}$, in spite of no incorporation of Fe. These properties can be improved by an addition of iron. Namely, it is evident that with the Fe-doped congruent composition LN single crystal, by the addition of 150 ppm of iron, the diffraction efficiency increased to about 20%, and the coupling coefficient increased to 15 cm$^{-1}$. On the other hand, with the iron-doped stoichiometrical composition LN single crystal, the diffraction efficiency and the coupling coefficient were as high as 72% and 27 cm$^{-1}$, which were the highest diffraction efficiency and coupling coefficient.

Figure 4:
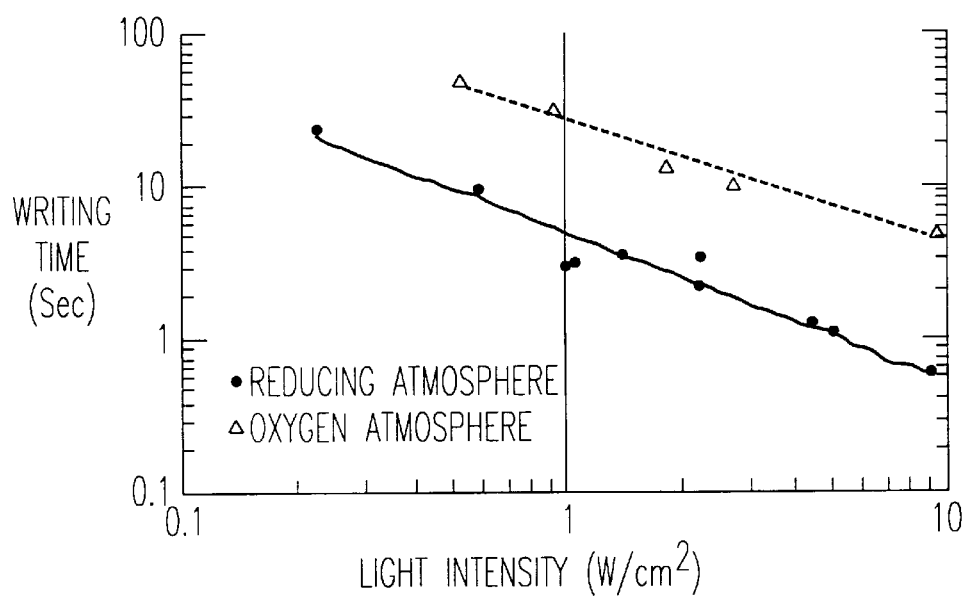
FIG. 4 is a graph showing the dependency on the light intensity of the hologram writing time of an iron-doped crystal with the stoichiometrical composition.

FIG. 4 is a graph showing the light intensity dependency of the writing time of a crystal with the stoichiometrical composition having 150 ppm of iron added, after its heat treatment. Here, the writing time is defined as the time until the diffraction efficiency in FIG. 2 will reach a constant level. The hologram writing speed depends on the intensity of light used, and the higher the light intensity, the higher the writing speed. Here, as shown in FIG. 4, it has been found that the writing time is proportional to an inverse number of the signal light intensity. When the intensity ratio of the pump light/signal light is 100, with a crystal heat-treated in a reducing atmosphere, the writing time is at most 1 second when the light intensity is at least about 5 W/cm$^2$, thus indicating a very high writing speed. If a laser beam intensity of about 5 W/cm$^2$ is used as the pump light intensity, it is unnecessary to use a large scale expensive laser beam apparatus for writing, and it is evident that the LN single crystal of the present invention has an excellent hologram property.

EXAMPLE 2

Commercially available powder materials of high purity $Li_2CO_3$ and $Nb_2O_5$ (purity of each of theme 99.999%) were mixed in a ratio of $Li_2CO_3:Nb_2O_5$ being 0.56–0.60:0.44–0.40 to obtain a Li component excessive material, and in a ratio of $Li_2CO_3:Nb_2O_5=0.50:0.50$ to obtain a stoichiometrical composition material. Iron oxide was added thereto within a range of from 2 to 1,000 ppm, to obtain starting materials. Then, the respective materials were subjected to rubber press molding under a hydrostatic pressure of 1,000 kg/cm$^2$. Then, the respective molded products were sintered in oxygen at a temperature of about 1,050° C. to obtain starting material rods. Further, as a powder starting material for continuous feeding, a mixed stoichiometrical composition material was sintered in oxygen at a temperature of about 1,050° C. to obtain a stoichiometrical composition material.

Then, for a single crystal growth by a double structure crucible method, the obtained Li component excessive material was filled in the inner crucible, and the stoichiometrical composition material was filled in the outer crucible, and then the crucibles were heated to prepare a melt. Here, the crucibles used for growing the crystal were made of platinum, and as the seed crystal, a LN single crystal of 5 mm×5 mm×length of 70 mm cut out in the Z-axis direction and being in a single domain state, was used. The growing conditions were such that the crystal rotational speed was 5 rpm, the withdrawing speed was 0.05 mm/hr, and the atmosphere was atmospheric air. Further, to make the melt composition uniform, the crucibles were slowly rotated at a speed of 0.2 rpm in a direction opposite to the seed crystal. By the growing for about 1.5 weeks, an iron-doped LN crystal having a diameter of 36 mm, a length of 65 mm and colored brown without cracks, was obtained. The obtained crystal as grown was cut into various directions, whereupon the internal domain state was inspected, whereby except for a minor portion in the vicinity of the surface of the crystal, the inner portion was uniformly in a single domain state.

The obtained LN single crystal was ascertained by a chemical analysis to be a single crystal very close to the stoichiometrical composition having a molar fraction of $Li_2O/(Nb_2O_5+Li_2O)$ of from 0.498 to 0.500 and having the concentration of non-stoichiometric defects suppressed to a large extent.

Then, the Curie temperature of the crystal as grown was measured by a differential thermal analysis, whereby the Curie points of samples cut out from various portions of the crystal were all within a range of from 1,198 to 1,200° C., and it was further ascertained that the Curie points of samples cut out from one crystal were constant irrespective of the cut out positions of the samples, thus indicating that the uniformity of the crystal composition was very high.

Further, from the single crystal as grown, a Y cut sample of 10 mm×10 mm×thickness of 2 mm was cut out and subjected to surface polishing by mechanochemical polishing. The light transmittance of the sample was measured by a spectrophotometer.

Figure 5:
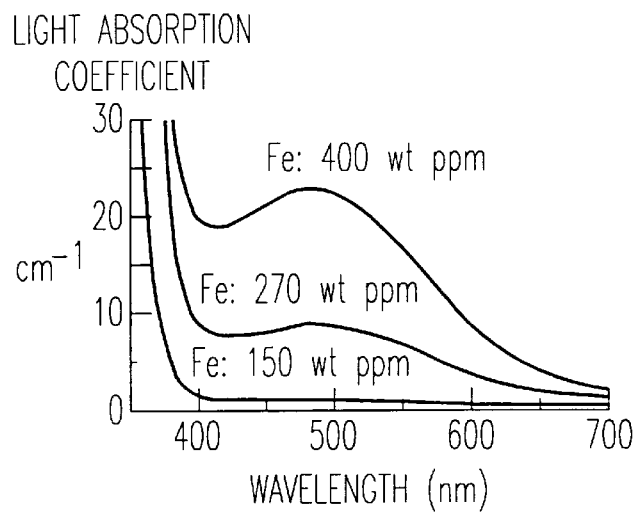
FIG. 5 is a graph showing the light absorption coefficient in the visible light range of the iron-doped LN single crystal with the stoichiometrical composition.

As shown in FIG. 5, with an iron-doped stoichiometrical composition LN single crystal, light absorption was observed at a wavelength of from 400 to 600 nm, and the property changed substantially by annealing. Further, a calibration curve useful for accurately determining the iron content in a crystal, was obtained as shown in FIG. 6.

Figure 6:
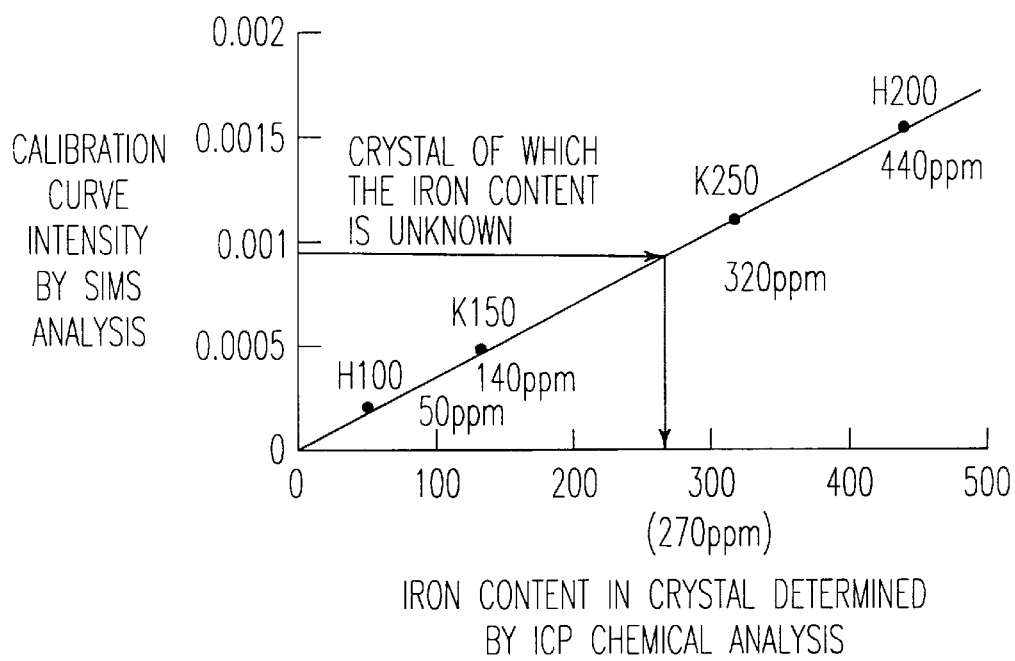
FIG. 6 is a graph showing the relation between the ICP chemical analytical value of the iron amount contained in an iron-doped LN single crystal with the stoichiometrical composition and the SIMS calibration curve strength.

The calibration curve strength analyzed by SIMS in FIG. 6 is in a good proportional relation with the iron content obtained by the chemical analysis. Accordingly, the iron content of a sample of which the iron content is unknown, can be determined from the calibration curve without conducting the chemical analysis. From the investigation of the iron distribution in a crystal grown by a double structure crucible method, it was ascertained that the composition was well controlled to be uniform, and the iron distribution in the crystal was excellent in the uniformity, although the segregation coefficient of iron was smaller than 1. A conventional crystal requires polarization treatment for a single domain, which requires a processing time of a few tens hours and which is called bowling, and Fe incorporated into a LN single crystal readily moves in the crystal by the polarization treatment, whereby a substantial gradient in the concentration will be formed in the crystal, and there has been a problem that the optical properties of the crystal tend to be non-uniform. It has now been found that such a problem can be solved by the iron-doped stoichiometrical composition crystal of the present invention.

It is known that when iron is incorporated to the congruent composition, the hologram diffraction efficiency and the coupling coefficient become higher than those of the crystal having no additive incorporated, and the higher the iron content, the higher the improvement in the hologram diffraction efficiency and the coupling coefficient. However, with the stoichiometrical composition crystal, it has high hologram diffraction efficiency and coupling coefficient already in a non-doped state. Accordingly, the improvement in the properties by an addition of iron is not so remarkable as compared with the congruent crystal. From the results of the measurement of the writing time of a diffraction lattice as shown in FIG. 12, it has been found that when the iron content in the stoichiometrical composition crystal is at least 10 ppm, the writing speed improves over the non-doped crystal.

If the amount of iron increases, the crystal growth tends to be difficult, and polycrystallization takes place during the growth, thus leading to a problem that cracks will form during the cooling. To obtain a crystal of good quality free from a problem of cracks or the like, the iron content in the crystal is at most 500 ppm. From these results, the iron content is suitably from 10 to 500 ppm, preferably from 100 to 300 ppm, whereby the writing speed is sufficiently high.

Figure 7A:
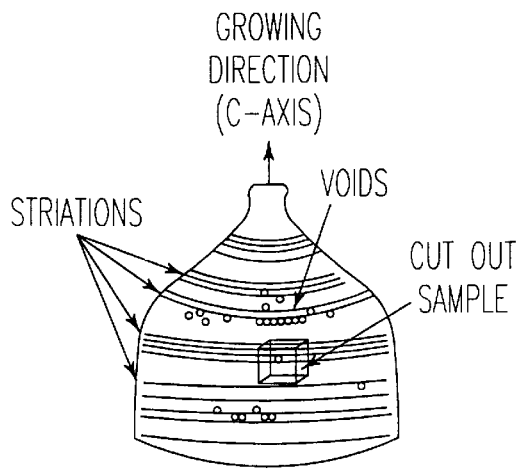
FIG. 7 illustrates observation by a polarization method of the optical uniformity in an iron-doped LN single crystal with the stoichiometrical composition and a Fe-doped LN single crystal with the congruent composition.
Figure 7B:
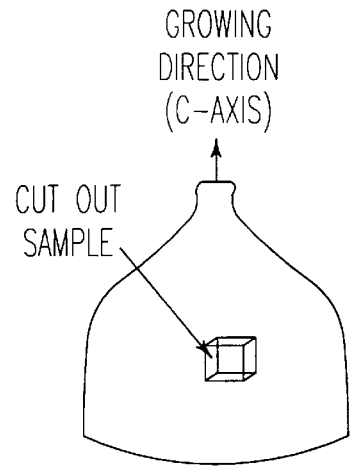

Further, the optical uniformity of a sample was inspected by a laser interference apparatus, whereby as shown in FIG. 7, with the stoichiometrical composition crystal (FIG. 7b), defects such as striations or voids which are caused by crystal defects, as usually observed in an iron-doped congruent composition crystal (FIG. 7a), were not observed, and it was ascertained that the refractive index uniformity was as high as the refractive index variation in the entire sample being at least $1\times10^{-5}$. Further, scattering contained in the crystal was evaluated by a laser micro prove method.

Figure 8A:
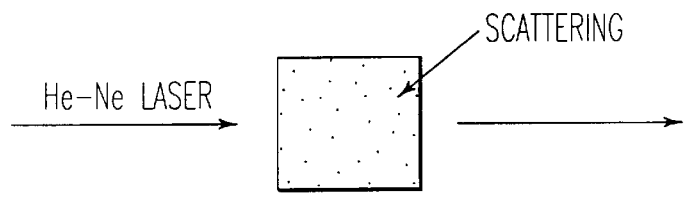
FIG. 8 is a diagrammatical view illustrating light scattering in a test specimen, when He—Ne laser with a wavelength of 633 nm was irradiated to an iron-doped LN single crystal with the stoichiometrical composition and a Fe-doped LN single crystal with the congruent composition.
Figure 8B:
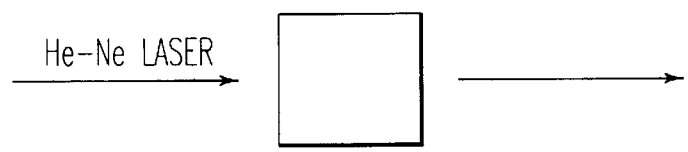

FIG. 8 diagrammatically illustrates the interior of a sample of 10 mm×10 mm×10 mm when a He—Ne laser with a wavelength of 633 nm was irradiated thereto, whereby no scattering of the laser was observed with the LN crystal grown by the present invention, and it was ascertained to be remarkably superior in the crystal quality to the LN single crystal having a few thousand ppm of Fe incorporated to a commercially available congruent composition.

EXAMPLE 3

Using Y cut samples of 10 mm×10 mm× thickness of 2 mm heat-treated under various conditions, the diffraction efficiency, the writing time and the hologram recording time, in a two wave mixing experiment, were measured. The heat treatment was carried out as follows. A LN single crystal as grown, having the stoichiometrical composition and a Curie point of 1,200° C., was sealed in a heat treating furnace capable of controlling the atmosphere, then heated to 950° C. in 10 hours and maintained at 950° C. for about 12 hours. Then, the sample was cooled to room temperature in about 10 hours and then taken out. The atmosphere of the furnace was four types i.e. in a 100% oxygen at a flow rate of 1 l/min, in a dried 100% nitrogen gas at a flow rate of 1 l/min, in a dried nitrogen gas containing 0.01% of oxygen at a flow rate of 1 l/min, and in a nitrogen gas containing steam at a flow rate of 1 l/min.

Figure 10:
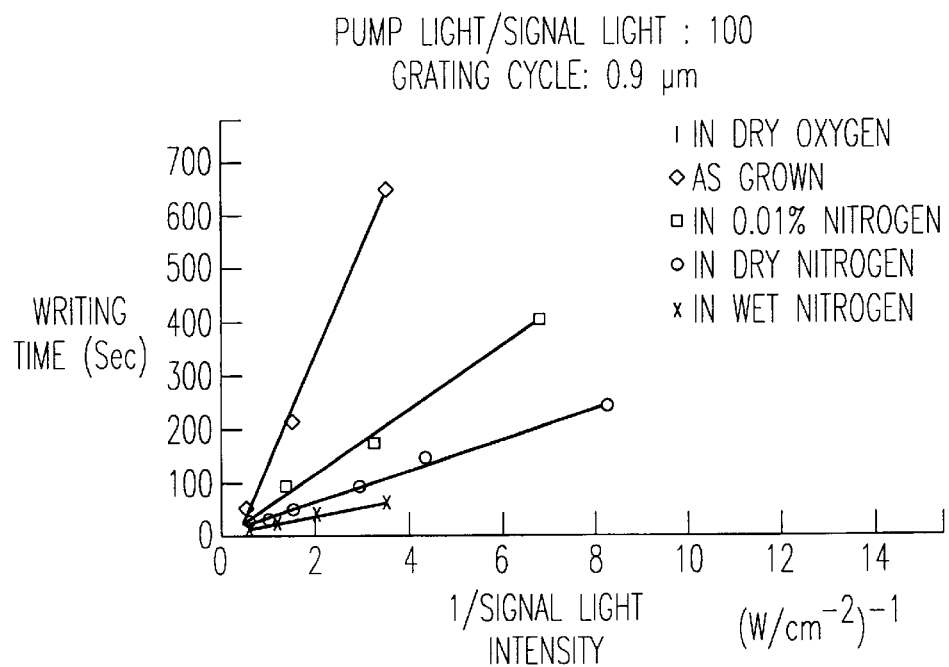
FIG. 10 is a graph showing the dependency on the signal light intensity of the hologram writing time of an iron-doped crystal with the stoichiometrical composition heat-treated under various conditions.

The results of the two wave mixture measurements of the respective samples after the heat treatment are shown in FIG. 10 as compared with the results of the crystal as grown. The results show that the writing time changes drastically depending upon the heat treatment conditions, and the writing speed was slowest when heat treatment was carried out in oxygen. On the other hand, the writing time was shortened by nitrogen treatment. Especially, it was found that by the heat treatment in a nitrogen gas containing steam, the writing time was shortest, whereby writing at the highest speed was possible. The writing time depends on the intensity of light used, and the higher the light intensity, the higher the writing speed. Here, the results show that the writing speed changes in proportion to an inverse number of the light intensity, and when the irradiated light intensity was about 5 W/cm$^2$, the writing time was as short as at most 1 second. From the above results, it is apparent that the hologram writing time can be optionally controlled by heat treatment of the stoichiometrical composition LN crystal and the light intensity to be used for writing.

EXAMPLE 4

Figure 11:
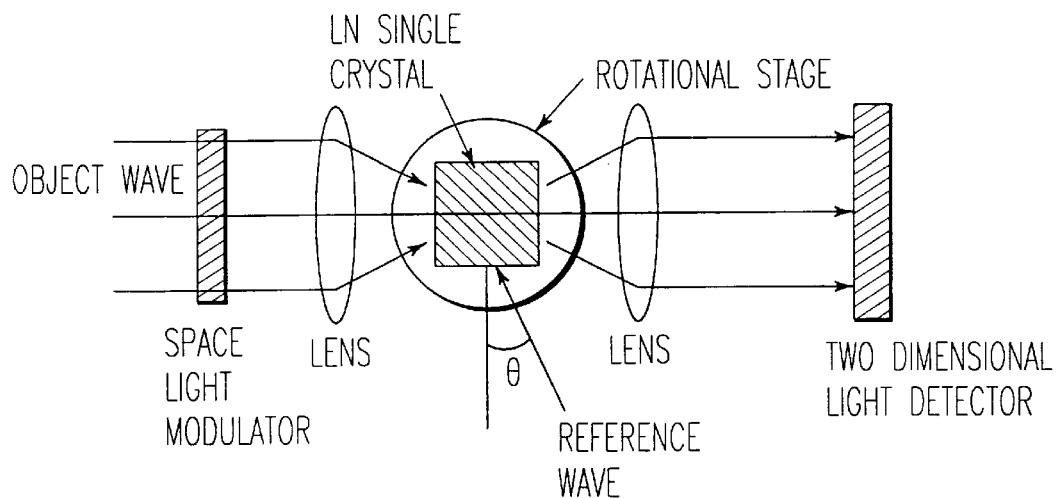
FIG. 11 is a view diagrammatically illustrating the construction of an optical laser device for writing a three dimensional hologram in a single crystal by means of a visible light laser beam.

A laser apparatus for writing a three dimensional hologram in a single crystal by means of a visible light laser beam, was prepared for a testing purpose. FIG. 11 shows a schematic illustration of the construction of the apparatus. This apparatus is a volume type hologram memory apparatus by an angle multiple system employing a LN single crystal having a high hologram diffraction efficiency of the present invention. The digital image input data will be developed in a graphic form on a space light modulator. Then, this graphic form is read out by a laser beam and used as an object wave for the hologram. A reference wave is irradiated substantially at a right angle thereto to write the interference fringes in the LN single crystal as the recording medium. Here, the LN crystal is disposed so that the c-axis of the crystal would be perpendicular to the direction of the interference fringes and placed on a stage capable of being rotated at a high precision. The crystal size was 1×1×1 cm$^3$. By gradually changing the crystal, data of about 200 sheets were recorded by multiple recording utilizing the selectivity of the Black diffraction. These data were reproduced by the reference wave and converted to electrical signals by a two dimensional light detector. The characteristics of the hologram recording here are such that the hologram is a phase type hologram where the refractive index changes, whereby a high diffraction efficiency can be expected, and a diffraction lattice can be written simply by irradiating interference fringes without requiring any developing treatment, and the hologram once written can be maintained. The hologram writing time depends on the environmental conditions such as the temperature, but with the iron-doped stoichiometrical composition LN single crystal, the writing can be made in a short period of time as compared with conventional crystals. The recording density of data with this construction is determined by the diffraction efficiency and the degree of noise. Heretofore, the noise attributable to random light scattering due to non-uniformity of the Fe-doped LN single crystal, has been problematic. Whereas, with the LN single crystal of the present invention, the diffraction efficiency is high, and the crystal is uniform and free from scattering whereby it has been found possible to substantially reduce the noise and to improve the recording density.

As described in detail in the foregoing, according to the present invention, it is possible to obtain an excellent LN single crystal which is uniform in the crystal structure and of a high quality and which has a coupling coefficient larger than 15 cm$^{-1}$, as it is a LN single crystal having the amount of non-stoichiometric defects controlled, and of which the composition of the matrix LN single crystal to which iron is added, is a composition close to the stoichiometrical composition. Further, it is possible to provide a LN single crystal having a high diffraction efficiency and an improved photorefractive response speed by heat treatment in a reducing atmosphere containing steam at a temperature not higher than the Curie point. Accordingly, by utilizing such properties, it is possible to present a three dimensional hologram memory element which is capable of writing at a high speed and with a large memory capacity by means of the LN single crystal of the present invention.

What is claimed is:

1. An iron-doped lithium niobate single crystal having an iron content of from 10 to 500 ppm, a molar fraction of Li$_2$O/(Nb$_2$O$_5$+Li$_2$O) of from 0.495 to 0.50, and a coupling coefficient larger than 15 cm$^{-1}$ measured by a two light wave mixture employing a wavelength of 532 nm.

2. An iron-doped lithium niobate single crystal having an iron content of from 10 to 500 ppm, a molar fraction of Li$_2$O/(Nb$_2$O$_5$+Li$_2$O) of from 0.495 to 0.50, and a response time for writing a hologram of 30 seconds at most, measured by a two light wave mixture employing a laser beam with a pump light intensity of 1 W/cm$^2$.

3. A method for heat treatment of the iron-doped lithium niobate single crystal as defined in claim 1, which comprises heat-treating the single crystal at a temperature of not higher than the Curie point of the single crystal in a reducing atmosphere.

4. A method for heat treatment of the iron-doped lithium niobate single crystal as defined in claim 2, which comprises heat-treating the single crystal at a temperature of not higher than the Curie point of the single crystal in a reducing atmosphere.

\* \* \* \* \*